US005824969A

United States Patent [19]
Takenaka

[11] Patent Number: 5,824,969

[45] Date of Patent: Oct. 20, 1998

[54] SPEAKER SYSTEM WITH A THREE-DIMENSIONAL SPIRAL SOUND PASSAGE

[76] Inventor: Masaaki Takenaka, 1-13-9, Higashinakashinjuku, Kashiwa-Shi, Chiba-Ken, Japan

[21] Appl. No.: 927,948

[22] Filed: Sep. 11, 1997

[30] Foreign Application Priority Data

| | | | |
|---|---|---|---|
| Sep. 30, 1996 | [JP] | Japan | 8-293111 |
| Mar. 18, 1997 | [JP] | Japan | 9-105095 |
| Jun. 4, 1997 | [JP] | Japan | 9-182945 |

[51] Int. Cl.[6] .................... H05K 5/00

[52] U.S. Cl. .................... 181/156; 181/145; 181/151; 181/153

[58] Field of Search .................... 181/144, 145, 181/146, 151, 152, 153, 156, 196, 199; 381/154, 158, 159, 160

[56] References Cited

U.S. PATENT DOCUMENTS

| | | | |
|---|---|---|---|
| 3,730,291 | 5/1973 | Goeckel . | |
| 3,923,124 | 12/1975 | Hancock | 181/156 |
| 4,168,761 | 9/1979 | Pappanikolaou | 181/156 |
| 4,298,087 | 11/1981 | Launay | 181/153 |
| 4,524,846 | 6/1985 | Whitby | 181/152 |
| 4,655,315 | 4/1987 | Saville | 181/153 |
| 4,819,761 | 4/1989 | Dick | 181/145 |
| 5,187,333 | 2/1993 | Adair | 181/152 |
| 5,189,706 | 2/1993 | Saeki | 181/156 |
| 5,373,564 | 12/1994 | Spear et al. | 181/156 |

*Primary Examiner*—Khanh Dang
*Attorney, Agent, or Firm*—Ladas & Parry

[57] ABSTRACT

A sound radiated from the back of a speaker unit passes through a three-dimensional spiral sound passage formed by a coaxial dual-tube structure of an outer tube and an inner tube, and by a spiral partition plate provided to bridge a gap between the outer tube and the inner tube before exiting the speaker system. The cross-sectional area of the spiral sound passage may continuously expand or remain constant.

9 Claims, 6 Drawing Sheets

SPEAKER SYSTEM WITH A THREE-DIMENSIONAL SPIRAL SOUND PASSAGE

BACKGROUND OF THE INVENTION

1. Field of the Invention

The present invention generally relates to speaker systems and, more particularly, to a cabinet construction for a high-fidelity speaker system.

When a diaphragm of a cone speaker is vibrated, the sound it radiates forward and the sound it radiates backward are in opposite phases. If a speaker unit comprising the diaphragm is energized without an accommodating cabinet, the forward sound and the backward sound cancel each other in the neighborhood of the diaphragm, resulting in reduced acoustic output. The degree of cancellation varies with the frequency such that it is more significant in the low-frequency range than in the mid-frequency range and the high-frequency range. A bare speaker unit is known to be very poor in bass reproduction.

In order to prevent the cancellation so as to obtain rich and well-balanced bass reproduction performance, many high-fidelity speaker systems commercially available today use cabinets having a variety of configurations to accommodate a speaker unit.

For example, a bass-reflex type cabinet, a back-loaded horn cabinet and a resonance pipe cabinet are known.

One of the most widely used cabinets is a bass-reflex type cabinet. An advantage of a bass-reflex type cabinet is its simple construction. However, since a bass-reflex type cabinet boosts only specific frequencies using Hermholtz resonance at a port, frequencies lower than the resonance frequency are significantly attenuated and the sound quality is unsatisfactory. For this reason, a bass-reflex type cabinet is often used in a multi-way system using a plurality of speaker units. A multi-way system requires a network for ensuring that each of the speaker units services a specific frequency range. An audio signal in a multi-way system is transmitted to a speaker unit via a capacitor, a coil and the like in the network, causing degradation in sound quality.

Another type of cabinet known as a back-loaded horn cabinet (hereinafter, referred to as a BH cabinet) is designed to boost low-frequency components included in the sound radiated from the back of a speaker unit, using an expanding cross-sectional area of an exponential horn or the like. A BH cabinet also prevents cancellation of the forward radiating sound and the backward radiating sound by creating a phase shift commensurate with the length of a sound passage. Normally, a folded horn construction in which linear sound passages are combined is used in order to reduce the size of a system. The cross-sectional area of a folded horn is made to expand in steps toward an outlet and the sound passage of the horn does not continuously curve.

A well-designed BH cabinet provides satisfactory bass reproduction performance so that only a single full-range speaker unit may be needed in the system. Since no network is necessary, degradation in sound quality caused by a network does not occur. By constructing a full-range speaker unit of a powerful magnetic circuit and a lightweight cone, a favorable response and improved bass resolution are afforded.

A disadvantage of a BH cabinet is that a relatively long sound passage and an associated large-sized system are required for satisfactory bass reproduction. Since a horn in a BH cabinet is formed by joining straight sound passages, degradation in sound quality occurs as a result of resonance inherent in straight sound passages. Turbulence in air current due to a large folding angle also causes degradation in sound quality. Moreover, since the construction of a folded horn is complex, a BH cabinet is not suitable for mass production. Finally, because part of the midrange/high-frequency sound passes through a folded horn and reaches a listener, the sound source becomes enlarged and blurred. Hence, it is difficult to appreciate stereophonic effects of the sound field.

One approach to overcome the above-described disadvantages of a BH cabinet is to use a spiral horn. For example, U.S. Pat. No. 3,923,124 and U.S. Pat. No. 3,730,291. disclose a spiral horn. These related art citations teach formation of a two-dimensional spiral horn by joining straight sound passages. The spiral horns in these citations are merely "spiral" on a plane. While such a horn provides some improvement in sound quality thanks to a relatively small folding angle, many of the disadvantages of a BH cabinet are not resolved. It may appear to be simple for a skilled person to construct a two-dimensional spiral horn to have smoothly extending interior walls. However, such a construction is complex and is not suitable for mass production. Moreover, such a horn requires a large area for placement. In short, many drawbacks of the related art remain to be solved.

A resonance pipe cabinet is designed to cause the sound radiating from the back of a speaker unit to pass through a folded resonance pipe that is one-quarter wavelength of the desired low-frequency cut-off frequency so that the sound is resonated. As a result, the cut-off frequency sound is boosted. For example, U.S. Pat. No. 4,655,315 details such a resonance pipe. In this approach, only a basic tone at the cut-off frequency and its harmonic overtones are boosted, resulting in a significantly rugged frequency characteristic below 1000 Hz and unfavorable sound quality.

SUMMARY OF THE INVENTION

Accordingly, an object of the present invention is to provide a compact mass-reproducible speaker system in which the aforementioned disadvantages are eliminated.

Another and more specific object of the present invention is to provide a compact mass-reproducible speaker system ensuring a satisfactory level of acoustic output in the low-frequency range, less poor sound quality, and successful appreciation of stereophonic effects of the sound field.

The aforementioned objects can be attained by a speaker system comprising: a speaker unit; a coaxial dual-tube structure consisting of an outer tube and an inner tube; and a spiral partition plate provided to bridge a gap between the outer tube and the inner tube so as to form a spiral sound passage, wherein a sound radiated from a back of the speaker unit passes through the spiral sound passage before exiting the speaker system.

The speaker system according to the present invention has the following advantages.

(1) With introduction of a three-dimensional spiral sound passage, a sufficient length sound passage is provided in a relatively small space so that richness in sound is available even in a compact system.

(2) Since a straight sound passage is substantially absent, unwanted resonance harmful to sound quality is controlled to a low level so that excellent sound quality results.

(3) The system is more suitable for mass-production than a conventional system using a BH cabinet so that reduction in production cost is facilitated.

(4) Since the spiral sound passage boosts bass, a single full-range speaker unit is capable of satisfactory bass reproduction performance, eliminating the necessity for a multi-way configuration and an attendant network.

(5) With the use of a full-range speaker unit, resolution of bass is improved.

(6) Since a baffle is substantially absent and the midrange/high-frequency components radiated from the back of the speaker unit are significantly reduced, the system operation approximates that of a point sound source. Therefore, excellent stereophonic effects of the sound field can be experienced.

SUMMARY OF THE INVENTION

Other objects and further features of the present invention will be apparent from the following detailed description when read in conjunction with the accompanying drawings, in which.

DESCRIPTION OF THE PREFERRED EMBODIMENTS

Figure 1:
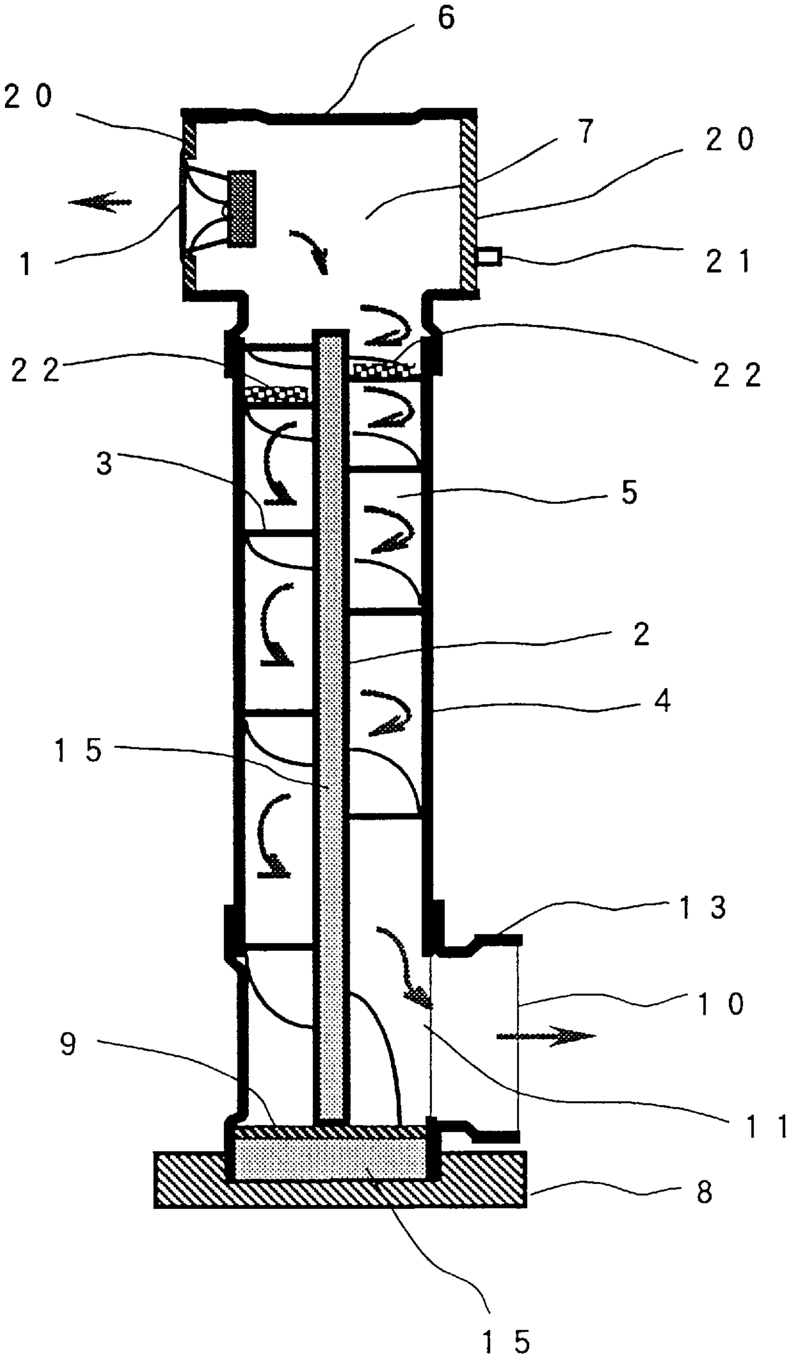
FIG. 1 shows a speaker system according to a first embodiment of the present invention.

FIG. 1 shows a speaker system according to the present invention.

The speaker system comprises a speaker unit 1, an air chamber 7, a spiral sound passage 5, a joint 11 and an exit opening 10 of the sound passage. The sound emerging from the back of the speaker unit 1 is radiated outside from the exit opening 10 via the air chamber 7, the spiral sound passage 5 and the joint 11.

The spiral sound passage 5 is formed by providing a spiral partition plate 3 to bridge a gap in a coaxial double-tubular structure consisting of an inner tube 2 and an outer tube 4. According to the present invention, a spiral is defined as a three-dimensional track described by continuous rotation around an axis and concurrent translation along the axis.

Unlike the aforementioned two-dimensional spiral horn in which a folded horn is produced by joining straight sound passages so as to form a passage extending spirally on a plane, the interior of the spiral sound passage according to the present invention is smoothly curved so that resonance is relatively unlikely. For this reason, it is less likely that spurious sound is produced. Moreover, since there is a relatively larger difference between a minimum distance defined by the inner bounds of the spiral sound passage and a maximum distance defined by the outer bounds of the spiral sound passage, it is safe to assume that a relatively large variation in phase shifts occurs. Enhancement or cancellation of specific frequencies which occurs when the sound from the horn is combined with the sound radiating from the front, and which causes a problem in the related art by producing a non-flat frequency characteristic containing a peak or a dip, can be prevented.

Since the main portion of the sound passage according to the present invention is three-dimensional spiral, a sound passage of a sufficient length is accommodated in a relatively small space, thus miniaturizing the resultant speaker system. Miniaturization according to the present invention chiefly refers to reduction of an area in which the speaker system is installed.

Figure 2:
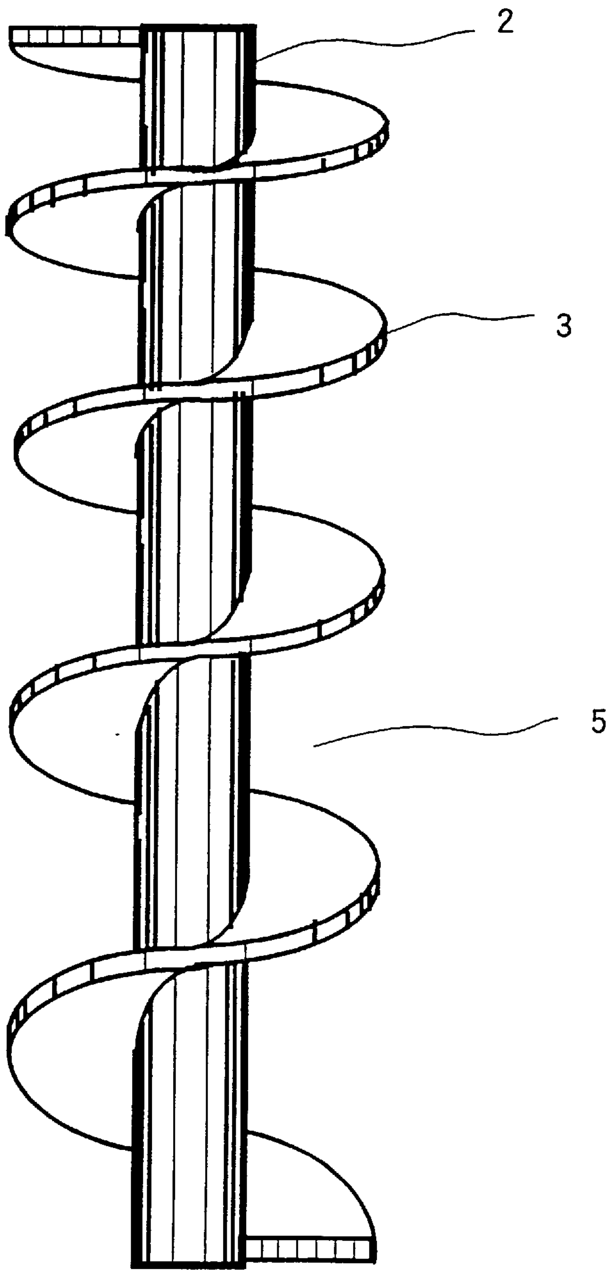
FIG. 2 is a perspective view of a spiral sound passage according to the present invention.

FIG. 2 is a perspective view of the spiral sound passage according to the present invention. Referring to FIG. 2, a combination of the inner tube 2 and the spiral partition plate 3 will be referred to as a spiral body. Referring to FIG. 1, the spiral sound passage 5 is produced by inserting the spiral body in the outer tube 4. FIG. 1 shows a construction in which the lower end of the spiral body is inserted into a T joint 13.

The length of the spiral sound passage 5 is defined as an axial length along the center of the diameter of the spiral sound passage 5. The diameter is defined as a mean diameter calculated from the inner diameter and the outer diameter. When the sound radiating from the back of the speaker unit passes through the air chamber 7 and the spiral sound passage 5, midrange/high-frequency components are attenuated to a certain degree so that low-frequency components and remnant midrange/high-frequency components are radiated outside from the exit opening 10. The direction of propagation is indicated by the arrows in FIG. 1.

The speaker unit 1 and the exit opening 10 may face the same direction or opposite directions. While the midrange/high-frequency components passing through the spiral sound passage 5 are attenuated to a certain degree, some portion thereof is radiated from the exit opening 10. For this reason, if the speaker unit 1 and the exit opening 10 face the same direction, the sound source as experienced by a listener becomes enlarged and blurred, so that the stereophonic effect of the sound field is impaired. FIG. 1 shows the speaker unit 1 and the exit opening 10 facing the opposite directions. With this arrangement, the midrange/high-frequency components are reduced almost to a negligible level by passing through the spiral sound passage and hardly reach the listener via the exit opening 10. As a result, a sound image is created substantially by a point-like sound source comprising the speaker unit 1, resulting in an excellent stereophonic effect of the sound field. The stereophonic effect of the sound field refers to a sensation of formation, size and position of a sound image.

Preferably, the length of the spiral sound passage is between 0.3 m and 4 m. If the passage is shorter than 0.3 m, reduction in midrange/high-frequency components and phase shifts in the low-frequency components is insufficient to produce high sound quality because, in such a case, low frequency components cancel each other so that the volume of the bass felt by the listener is reduced. If the passage length exceeds 4 m, sound quality becomes poor because a time delay caused in the sound exiting the exit opening 10 before reaching a listener becomes less negligible. In addition, since air resistance in the sound passage increases, the acoustic output drops.

There are no particular requirement for the number of spiral turns that the spiral sound passage should make. However, it is preferable that the passage makes at least one spiral turn in order to reduce midrange/high-frequency components sufficiently.

The cross-sectional area of the spiral sound passage is defined as an area of a section through a plane that includes an axis of the coaxial dual-tube structure. Given that the effective vibration area of the speaker unit is 1, a throat of the spiral sound passage may preferably have a cross-sectional area of between 0.1 and 1.5. The cross-sectional area of the spiral sound passage may remain unchanged in the direction of travel of the sound. Normally, it is more preferable that the sound passage is flared or continuously expanded in cross-sectional area. By making the passage to continuously expand, it is expected that the low-frequency components are boosted as in a folded BH cabinet. If the cross-sectional area remains unchanged, an advantage of reduced size (particularly, the height) of the speaker system is afforded.

Continuous expansion of the spiral sound passage may not necessarily be exponential as long as it is gradual and smooth. The sound passage may expand in its height, width or both. FIGS. 1 and 2 show a case where the height of the passage expands while its width remain unchanged. Other approaches to expand the sound passage by expanding its width may include enlarging the diameter of the outer tube toward the bottom of the speaker system or reducing the diameter of the inner tube toward the bottom.

In the cabinet structure of FIG. 1, the sound traveling through the spiral sound passage 5 is radiated outside from the exit opening 10 via the joint 11. The cross-sectional area of the exit opening 10 is preferably larger than the effective vibration area of the speaker unit 1 or the cross-sectional area of the exit of the spiral sound passage 5. With such an arrangement, air resistance is reduced and the boost provided by the horn to bass is improved.

The position of the lower end of the spiral partition plate 3 in the joint 11 is to be defined so that the sound passing through the spiral sound passage 5 travels to the exit opening 10 as smoothly as possible.

While it is desirable that the cross-section of the inner tube 2 and the outer tube 4 is circular, an oval or elliptical cross-section is also possible. The inner tube 2 and the outer tube 4 are arranged on a common axis so as to form a coaxial dual-tube structure. Tubes with a circular cross-section are easier to produce than tubes of other configurations. Moreover, tubes with a circular cross-section enable forming a sound passage with substantially no straight portions in the direction of travel the sound. Therefore, resonance is unlikely to occur and air turbulence is diminished. The inner tube 2 may be a solid object instead of a hollow tube. If the inner tube 2 is hollow, adverse effects on sound quality due to vibration in the inner tube can be reduced by filling the tube with sand or lead particles. The outer tube and the inner tube may not necessarily have a regular diameter over its extent, as described previously.

Figure 6:
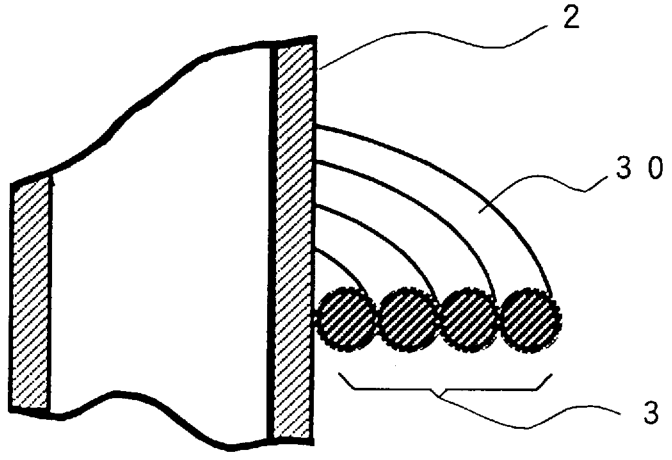
FIG. 6 shows a cross-sectional view showing how the spiral spiral partition plate 3 is formed.

The spiral sound passage 5 may be formed of a variety of materials and according to a variety of methods. For example, the spiral partition plate 3 may be formed such that a band-like rubber plate or a cabtire cable 30 is wrapped one upon another around the inner tube 2, as shown in FIG. 6, and glued to the inner tube 2 by an adhesive. When the spiral partition plate 3 is formed of a flexible material such as a cabtire cable, it is desirable that the rigidity of the spiral partition plate 3 is improved by applying an epoxy resin or the like to the spiral partition plate 3 in order to prevent vibration. The resultant spiral body is inserted into the outer tube 4 and the T joint 13. By joining the periphery of the spiral partition plate 3 with the interior of the outer tube 4 and the T joint 13, the spiral sound passage 5 is formed.

Various other methods are available to mass-produce the spiral sound passage 5. Plastic injection molding would be especially preferable. Each block manufactured by plastic injection molding would correspond to one spiral turn of the spiral body or of the combination of the outer tube 4 and the spiral body. Alternatively, each block manufactured by plastic injection molding may not form a complete spiral turn. The spiral sound passage or the spiral body is formed by joining a plurality of blocks thus produced. Such a production method does not require high-level craftsmanship and can be used to produce the speaker system of the present invention because its structure is suitable for mass-production.

There is no specific requirement for a material for forming the outer tube 4, the inner tube 2, the spiral partition plate 3, etc. In addition to wood that are normally used for a cabinet, they may be formed of plastics of various types; a composite material composed of a resin of various types and a metal fiber, a glass fiber, a carbon fiber or an aramid fiber. Other materials that can be used include a composite material composed of timber chips and a resin; a composite material composed of a plastic and inorganic particles, metal particles or organic particles such as timber particles; a polymer alloy composed of a plastic and a rubber; and a polymer alloy composed of plastics of different kinds. The above-mentioned materials may be used alone or in combinations. Materials that include a plastic as a main component would be particularly preferable to mold the spiral sound passage.

The speaker unit 1 may be fitted to the coaxial dual-tube structure using a T joint 6. Alternatively, an L joint or other tubular members may be used. Such a tubular member may be produced by plastic injection molding or the like. By fitting the speaker unit 1 to that portion (hereinafter, referred to as a horizontal tubular section) of the tubular member which is horizontal or which forms a 60°–120° angle with respect to the axis of the spiral sound passage, the air chamber 7 for guiding the sound radiated from the back of the speaker unit 1 to the spiral sound passage is formed. By fitting the speaker unit 1 at the end of the horizontal tubular section, it is assumed that substantially no baffle exists. Therefore, an excellent stereophonic experience nearing the quality produced by a point sound source is obtained.

Figure 4:
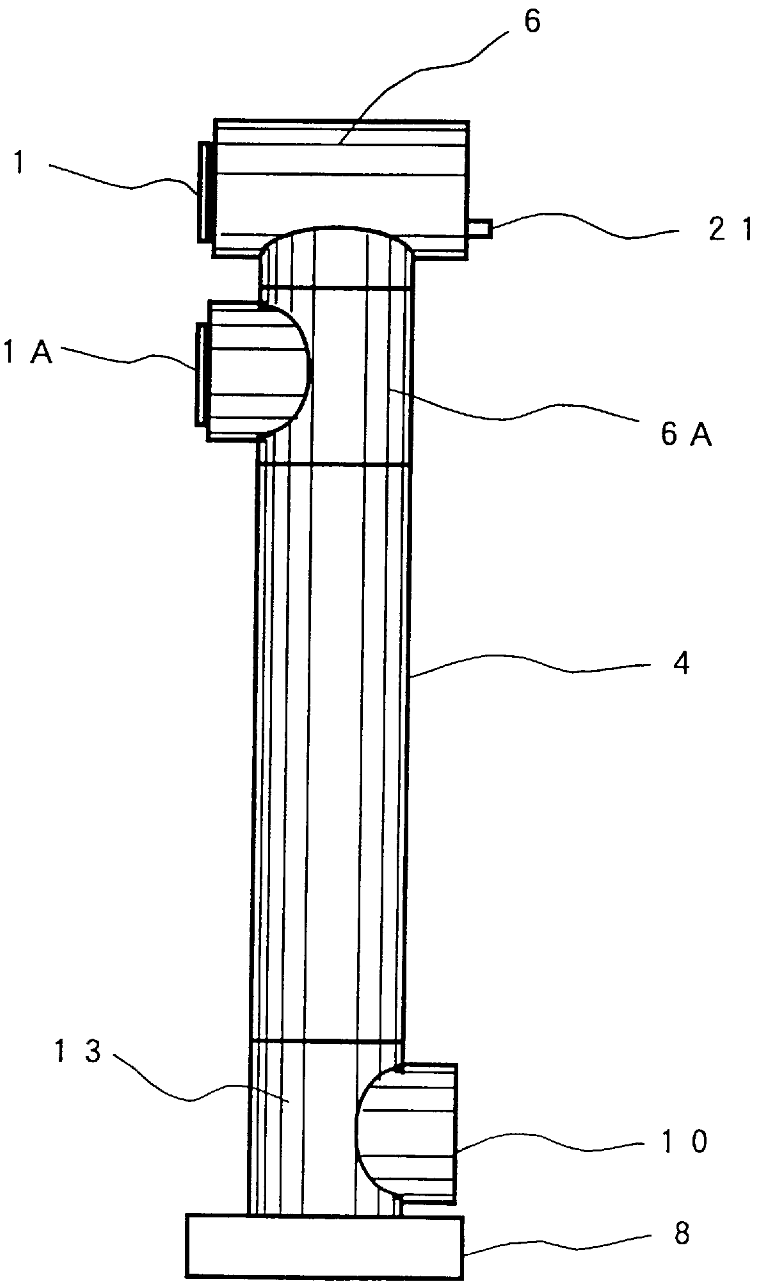
FIG. 4 shows a speaker system according to a third embodiment of the present invention.
Figure 5:
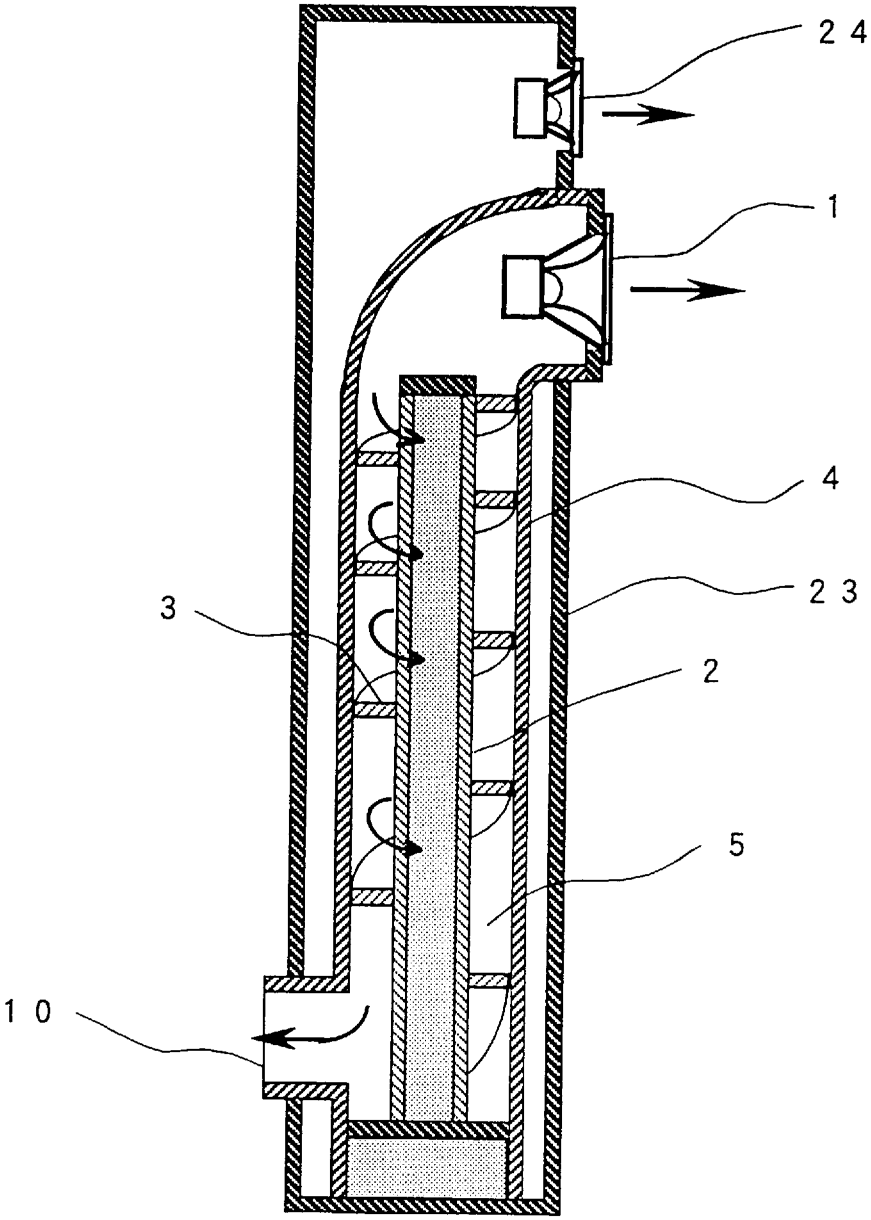
FIG. 5 shows an alternative construction of the speaker system according to the present invention.

Preferably, the speaker unit 1 used in the present invention is embodied by one full-range speaker unit. Alternatively, a plurality of speaker units may be used. A network may also be used. The plurality of speaker units may be fitted to the cabinet such that two speaker units may be assembled to the front and the back of the T joint 6 or a similar tubular member. Alternatively, as shown in FIG. 4, a second T joint 6A may be inserted between the T joint 6 and the outer tube 4. In another approach, the T joint 6 may be formed to have an elliptical or oval frontal face so that a plurality of speaker units are fitted to the elliptical or oval frontal face. In still another approach, an external box may be used, as shown in FIG. 5.

Figure 3:
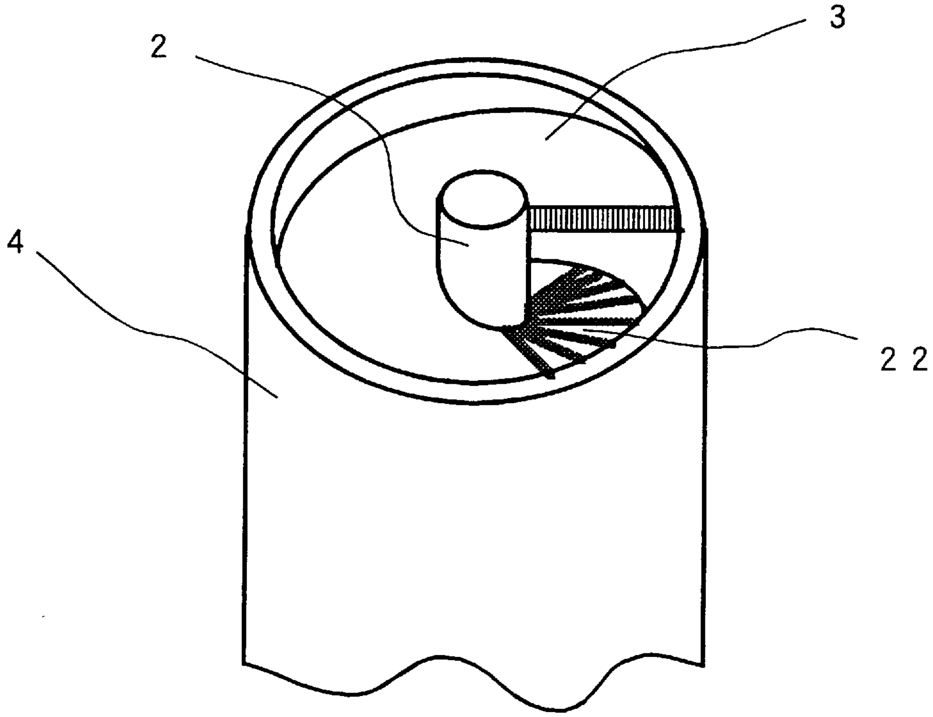
FIG. 3 shows how a throat of the sound passage is covered by a soft material.

A phenomenon called booming is known to occur in a small speaker system. Booming is abnormal boost to a specific frequency range as when the sound of a specific bass musical instrument such as a cello is reproduced. When booming occurs, sound quality is impaired. Such a phenomenon is quite rare in the speaker system of the present invention and, if it ever occurs, it is hardly detectable. While it is considered that booming does not pose a serious problem in the present invention, a method is conceivable in order to further ensure that booming is prevented. Referring to FIGS. 1 and 3, according to this method, a portion or the entirety of the wall of the neighborhood of the throat of the spiral sound passage is covered by a soft material 22 so that the cross-sectional area of the throat is slightly reduced.

The soft material may be a fibrous or porous material such as a urethane foam, sponge rubber, felt or glass wool. Other soft materials that could be used include a soft rubber, a bag-like body containing a gas or a liquid, and a plastic or rubber sheet (film) having a center thereof bulging away from the wall and having at least one end thereof adhesively attached to the wall.

The speaker system according to the present invention as shown in FIGS. 1 and 4 differ significantly in appearance from a widely used box speaker system. As shown in FIG. 5, by accommodating the speaker system in a box 23 and maintaining the speaker unit and the exit opening 10 exposed, the difference in appearance can be relieved. FIG. 5 shows a case where the bass speaker unit 1 and a midrange/high-frequency speaker unit 24 are used.

According to the present invention, the sound radiated from the back of the speaker unit and in a reversed phase relationship with the sound radiated from the front exit via the spiral sound passage 5. The spiral sound passage is sufficiently long to control cancellation between the front sound and the back sound to a low level. With the added benefit provided by the expansion of the cross-sectional area of the spiral sound passage, acoustic output in the bass range is satisfactorily improved. Thus, a network used in a multi-way system is not necessary so that degradation in sound quality accompanying the use of a network is avoided. The advantage provided by diminutive resonance in the spiral sound passage adds to excellent quality of the reproduced sound. Unlike a woofer, a full-range speaker unit is characterized by a small cone weight and a favorable signal adapting characteristic. Therefore, a full-range speaker unit can constitute a speaker system with excellent bass resolution and high sound quality. Since the speaker unit 1 is fitted to the horizontal tubular section so that substantially no baffle exists, and since the exit opening 10 and the speaker unit 1 are aimed in opposite directions, the remnant midrange/high-frequency components radiated from the back of the speaker unit and traveling through the spiral sound passage are significantly reduced, resulting in excellent stereophonic effect of the sound field as experienced by a listener.

The speaker system according to the present invention can be produced relatively easily using the method described above. Since the construction is relatively simple, the speaker system is suitable for mass-production. As a result, the goals of stabilizing product quality and reduction in production cost are attained at the same time.

A detailed description will now be given of the speaker system according to the present invention.

FIG. 1 shows the speaker system according to a first embodiment of the present invention with an expanding spiral sound passage. The outer tube 4 is formed by cutting a hard polyvinylchloride JIS-compliant pipe having an inner diameter of 125 mm (VP125) to a length of 600 mm. The inner tube 2 is a hard polyvinylchloride JIS-compliant pipe having an inner diameter of 30 mm (VP30). There is a gap of 42 mm between the inner tube 2 and the outer tube 4. As shown in FIG. 6, the spiral partition plate 3 is formed by wrapping four cabtire cables of a diameter of 10 mm one upon another around the periphery of the inner tube 2 and by securing the cabtire cables to each other and to the inner tube 2 by a cyanoacrylate adhesive. By wrapping a vinyl tape, the outer diameter of the spiral body is adjusted to 125 mm. Further, an epoxy resin is applied to the entirety of the upper major surface and the lower major surface of the spiral partition plate embodied by the cabtire cables so that the spiral partition plate is made rigid enough to prevent unwanted vibration from occurring. An epoxy resin adhesive is applied to the periphery of the spiral body thus produced before being inserted into the outer tube 4 and the T joint 13. The spiral sound passage 5 is formed by adhesively fixing the spiral body to the outer tube 4 and the T joint 13.

The length of the spiral body as shown in FIG. 2 is 750 mm which is equal to the length of the inner tube 2. The number of spiral turns that the spiral sound passage makes is 3.5. The spiral sound passage is made to expand such that the cross-sectional area at the throat is 38 $cm^2$, 52 $cm^2$ at the end of the first turn, 65 $cm^2$ at the end of the second turn, 84 $cm^2$ at the end of the third turn, and 103 $cm^2$ at the end of 3.5 turns (the exit of the spiral sound passage). Expansion of the cross-sectional area is configured such that the width of the spiral sound passage is constant, while the height thereof expands continuously. The length of the spiral sound passage thus produced is 1.6 m.

The T joint 6 and the T joint 13 are both hard polyvinylchloride JIS-compliant products that match the VP125 product mentioned above. The inner diameter of the exit opening 10 aimed in an opposite direction with respect to the speaker unit 1 is 135 mm, and the cross-sectional area thereof is 143 $cm^2$. In this construction, the number of spiral turns that the spiral partition plate 3 makes is 4.5. That portion between the end of the fourth turn and the end of 4.5 turns is inserted into the T joint 13 and adhesively attached to the interior wall thereof. The lower end of the spiral partition plate 3 is adhesively attached to a bottom plate 9 (plywood of 15 mm thickness) to which the lower end of the inner tube 2 is also adhesively attached. The peripheral position of the bottom end of the spiral partition plate 3 was determined by controlling the orientation of the spiral body so that the sound passing through the spiral sound passage is smoothly guided to the exit opening 10. The interior of the inner tube 2 is filled with sand so as to reduce unwanted vibration inside the cabinet.

The 10 cm full-range speaker unit Technics EAS-10F20 from Matsushita Electric was fitted to the end of the horizontal tubular section of the T joint 6. This speaker unit product is provided with a powerful magnetic circuit using a large ferrite magnet and a lightweight cone having an equivalent mass of 3.8 g. The impedance is 8 Ω and the effective vibration area is 64 $cm^2$. The interior of the T joint 6 constitutes the air chamber 7 behind the speaker unit 1 embodied by this product. The air chamber 7 is defined by a terminal 21 and two pieces of plywood 20 to which the speaker unit 1 is fitted. The effective volume of the air chamber 7 is approximately 2 liters. A sound absorbing material (not shown) is attached to the interior of the air chamber 7. As shown in FIGS. 1 and 3, the spiral partition plate 3 in the neighborhood of the throat of the spiral sound passage is covered by a soft material embodied by a felt having a thickness of 10 mm, a width of 40 mm and a length of 100 mm. The height of the system thus constructed is 980 mm.

The speaker system according to the present invention is capable of reproducing a sound ranging from 40 Hz bass to 20 kHz high-pitched tone. High resolution of low-frequency components and resultant richness of bass as felt by a listener are to be particularly appreciated. Sound quality is excellent due to the absence of spurious sound such as reverberations and repercussions normally experienced with a conventional BH cabinet. Moreover, the stereophonic effect of the sound field formed by the speaker system of the present invention is excellent.

A description will now be given of the speaker system according to a second embodiment of the present invention.

A compact speaker system was produced wherein the cross-sectional area of the spiral sound passage is substantially constant. The basic configuration of the system is similar to the configuration shown in FIG. 1 so that an illustration of the second embodiment is omitted. The cabinet is formed of the outer tube 4, the T joint 6, the T joint 13 and the like. The outer tube 4 is produced by cutting a hard polyvinylchloride JIS-compliant pipe having an inner diameter of 125 mm (VP125) to a length of 250 mm. The T joint 6 and the T joint 13 are hard polyvinylchloride JIS-compliant pipes that match the VP125 product.

The inner tube 2 is a polyvinylchloride JIS-compliant pipe having an inner diameter of 30 mm (VP30) and a length of 400 mm. The lower end of the inner tube 2 is adhesively fixed to the bottom plate 9 (plywood of 15 mm thickness). The inner tube 2 is filled with sand. The lower-most 150 mm portion (the portion inserted into the T joint 13) is not provided with the spiral partition plate.

The spiral partition plate 3 is formed by the same method as used in the first embodiment. The resultant spiral sound passage makes 2 spiral turns with a constant cross-sectional area of 31 $cm^2$ and extends approximately 0.9 m.

A 10 cm full-range speaker unit 1 was fitted to the horizontal tubular section of the T joint 6 so as to be located above the spiral sound passage, as in the first embodiment. The speaker system is completed by disposing the exit opening 10 formed by the T joint 13 at the lower end of the spiral sound passage. The exit opening 10 of the sound passage is aimed in opposite directions with respect to the speaker unit 1. The overall height of the speaker system is 630 mm.

The speaker system according to the second embodiment described above is capable of reproducing a sound ranging from 50 Hz bass to 20 kHz high-pitched tone. High resolution of low-frequency components is particularly appreciated. Sound quality is excellent due to the absence of spurious sound such as reverberations and repercussions normally experienced with a conventional BH cabinet. Moreover, the stereophonic effect of the sound field formed by the speaker system is excellent.

A description will now be given of the speaker system according to a third embodiment of the present invention.

FIG. 4 shows the system of the third embodiment where two speaker units are used. The construction of the speaker system below the speaker units including the spiral sound passage is the same as the construction of the first embodiment. Two T joints 6 and 6A are combined so that the speaker units 1 and 1A are fitted to respective horizontal tubular sections so as to face outward. The sound radiated from the back of the speaker units 1 and 1A joins each other and passes through the spiral sound passage before being radiated outside via the exit opening 10. The orientation of the two speaker units 1 and 1A can be controlled independently by rotating the T joints 6 and 6A. FIG. 4 shows a case where the two speaker units 1 and 1A have the same orientation so that they are aimed in opposite directions with respect to the exit opening 10.

Each of the speaker units 1 and 1A is the same as the speaker unit in the first embodiment. The speaker units 1 and 1A are connected in parallel without using a network. The overall height of the speaker system is 1180 mm.

The speaker system according to the third embodiment described above is capable of reproducing a sound ranging from 31.5 Hz bass to 20 kHz high-pitched tone. High resolution of low-frequency components is particularly appreciated. Sound quality is excellent due to the absence of spurious sound such as reverberations and repercussions normally experienced with a conventional BH cabinet. Moreover, the stereophonic effect of the sound field formed by the speaker system is excellent.

The present invention is not limited to the above described embodiments, and variations and modifications may be made without departing from the scope of the present invention.

What is claimed is:

1. A speaker system comprising:

a speaker unit;

a coaxial dual-tube structure comprising an outer tube and an inner tube; and a spiral partition plate provided to bridge a gap between said outer tube and said inner tube so as to form a spiral sound passage, wherein a sound radiated rearwardly from said speaker unit passes through said spiral sound passage before exiting the speaker system.

2. The speaker system as claimed in claim 1, wherein a length of said spiral sound passage is in a range of between about 0.3 m and about 4 m.

3. The speaker system as claimed in claim 1, wherein a cross-sectional area of said spiral sound passage expands gradually toward an exit of said spiral sound passage.

4. The speaker system as claimed in claim 1, wherein a cross-sectional area of said spiral sound passage remains constant.

5. The speaker system as claimed in claim 1, wherein the sound passing through said spiral sound passage is radiated externally via an exit opening of said spiral sound passage, and a cross-sectional area of said exit opening is larger than an effective vibration area of said speaker unit.

6. The speaker system as claimed in claim 1, wherein said exit opening is in an opposite direction with respect to said speaker unit.

7. The speaker system as claimed in claim 1, wherein said speaker unit is fitted at an end of a horizontal tubular section above said coaxial dual-tube structure.

8. The speaker system as claimed in claim 1, wherein at least a portion of a wall in an area a throat of said spiral sound passage is covered by a soft material.

9. A speaker system comprising:

a plurality of speaker units;

a coaxial dual-tube structure comprising an outer tube and an inner tube; and a spiral partition plate provided to bridge a gap between said outer tube and said inner tube so as to form a spiral sound passage, wherein a sound radiated rearwardly from one of said plurality of speaker units passes through said spiral sound passage before exiting the speaker system.

* * * * *